United States Patent [19]

Abbe et al.

[11] Patent Number: 4,860,229
[45] Date of Patent: Aug. 22, 1989

[54] WAFER FLATNESS STATION

[75] Inventors: Robert C. Abbe, Newton; Noel S. Poduje, Needham Heights; Neil H. Judell, Jamaica Plain, all of Mass.

[73] Assignee: ADE Corporation, Newton, Mass.

[21] Appl. No.: 282,877

[22] Filed: Dec. 9, 1988

Related U.S. Application Data

[63] Continuation of Ser. No. 572,695, Jan. 20, 1984, abandoned.

[51] Int. Cl.[4] .............................................. G01R 27/26
[52] U.S. Cl. ................................. 364/563; 324/61 R; 73/104
[58] Field of Search ............ 364/563; 324/61 R, 61 P; 358/342; 73/104, 105; 369/58, 60; 33/552

[56] References Cited

U.S. PATENT DOCUMENTS

| | | | |
|---|---|---|---|
| 3,523,246 | 8/1970 | Hall et al. | 324/61 R |
| 3,899,832 | 8/1975 | Hunyar | 33/552 |
| 3,990,005 | 11/1976 | Abbe et al. | 324/61 P X |
| 4,047,029 | 9/1977 | Allport | 364/563 X |
| 4,152,641 | 5/1979 | Hughes et al. | 324/61 R X |
| 4,158,171 | 6/1979 | Abbe et al. | 324/61 R X |
| 4,190,797 | 2/1980 | Lecklider et al. | 324/61 R |
| 4,280,354 | 7/1981 | Wheeler et al. | 73/105 X |
| 4,295,216 | 10/1981 | Truesdell et al. | 324/61 R X |
| 4,403,419 | 9/1983 | Graves | 73/105 X |
| 4,481,616 | 11/1984 | Matey | 358/342 X |
| 4,525,751 | 6/1985 | Freeman et al. | 358/342 |
| 4,560,924 | 12/1985 | Nordberg | 324/61 R |
| 4,561,087 | 12/1985 | Fox et al. | 358/342 X |
| 4,602,359 | 7/1986 | Palmer | 369/53 |

FOREIGN PATENT DOCUMENTS

| | | | |
|---|---|---|---|
| 0943187 | 3/1974 | Canada | 324/61 P |
| 2107550 | 4/1983 | United Kingdom | 358/342 |

OTHER PUBLICATIONS

Black, R. H., "A Capacitance Method for Measuring the Thickness of Thin Water Sheets", *Research and Development Technical Report* USNRDL-TR-315, Apr. 3, 1959.

Mits et al., "Measurement of Oil Film Thickness in Sliding Contact", *Soviet Materials Science*, vol. 8, No. 5, Sep./Oct. 1972 (Publ. Sep. 1974), pp. 613–615.

Migitaka et al., "An Automated VLSI-Mask Inspection System", *J. Vac. Sci. Technol.*, 20(1), Jan. 1982, pp. 26–32.

*Primary Examiner*—Parshotam S. Lall
*Assistant Examiner*—Joseph L. Dixon
*Attorney, Agent, or Firm*—Weingarten, Schurgin, Gagnebin & Hayes

[57] ABSTRACT

An automatic wafer flatness station is disclosed for obtaining a flatness profile of a semiconductor wafer or other sample from thickness data. The sample to be flatness profiled is supported so that it maintains its natural shape. A processor coupled to a capacitive thickness sensing head and to the support medium is operative to successively position each of a plurality of preselected points of the sample into proximity with the capacitive thickness sensing head for measuring the thickness of the sample at the corresponding point. An analog-to-digital converter converts the thickness measurement into data that is stored in a data table in system memory, the individual addresses of which correspond to the spacial location on the sample of each such preselected point. The processor is operative after the data table is compiled for each sample to compute the flatness profile of one surface therefrom relative to a selectable plane. That plane typically maps the other surface of the sample into a plane, for example, simulating the condition where the sample is held in an ideal vacuum chuck for semiconductor processing at which point surface flatness is needed. Other planes may be defined by least squares analysis and 3-point techniques, among others.

21 Claims, 4 Drawing Sheets

WAFER FLATNESS STATION

This application is a continuation of application Ser. No. 572,695, filed Jan. 20, 1984, now abandoned.

FIELD OF THE INVENTION

This invention is directed to the field of materials processing, and more particularly, to a novel semiconductor wafer flatness station.

BACKGROUND OF THE INVENTION

The production and quality control processes used by semiconductor device manufacturers and material producers, among others, often require a precise knowledge of such wafer characteristics as flatness, thickness, resistivity, and orientation, among others. Automated, high throughput assembly-line systems may be employed to obtain the desired information. Typically, the wafers are aligned about their centers, and then moved to a wafer flatness station. The flatness station is operative to provide information representative of the degree of flatness, or deviation from a planar or other intended surface, for each wafer. Such information may be advantageously utilized, for example, during the various phases of photolithographic processing typically employed in electronic circuit device fabrication.

SUMMARY OF THE INVENTION

The present invention provides a wafer flatness station that automatically obtains a flatness profile of a wafer which is suitable for use in automated production and quality control. The wafer flatness station suitably may be packaged in a module which is compatible for use with other wafer characterization stations in a high throughput material processing system. The microprocessor based wafer flatness station of the invention ordinarily requires about 7.2 seconds after receipt of a wafer to obtain its flatness profile, and can process on the average up to about 500 wafers per hour routinely without the need for operator intervention.

The novel flatness station of the present invention contemplates means for obtaining first data representative of thickness at successive ones of a plurality of preselected points selected to substantially cover the spacial region of a sample to be profiled, and means responsive to the first data for providing second data representative of the flatness of the sample. In an exemplary embodiment, the flatness station of the present invention is employed to obtain the flatness of a semiconductor wafer. The wafer flatness station in preferred embodiment includes a vacuum chuck rotatable about a $\theta$ axis and displaceable about orthogonal X and Z axes for removably supporting the wafer for rotation about the $\theta$ axis and for translation along the X and Z axes in response to $\theta$, X, and Z control signals. A capacitive sensor is provided adjacent the vacuum chuck for providing an electrical signal representative of the thickness of the wafer. A system controller having memory coupled to the vacuum chuck and to the capacitive sensor is operative to produce $\theta$, X, and Z control signals that so rotate and translate the chuck that successive ones of a plurality of preselected points of the wafer selected to substantially cover the entire extent of the wafer are brought into proximity with the capacitive sensor. For each such point, the system controller is operative to digitize the corresponding electrical signal and store data representative of the wafer thickness at that point in a predetermined memory location associated therewith. The thickness data for all such points produces a data table in memory the address locations of which correspond to the spacial location of each such preselected point of the wafer. The system controller is operative in response to the data contained in the data table to compute a selected flatness profile therefrom. The system controller preferably includes a first central control processor and a second processor slaved to the central control processor. The central control processor controls wafer movement through the flatness module, instructs the second processor to compile the data table for each particular wafer, and computes its flatness profile. The second processor controllably rotates and translates the vacuum chuck and reads the capacitive sensor values in accordance with instructions downloaded thereto by the central control processor to produce the data table, and sends the compiled data to the central control processor for computation of a selected flatness profile. The flatness module of the present invention can advantageously be employed to obtain selected flatness profiles for samples other than semiconductor wafers such as metal masks and memory discs and other objects without departing from the inventive concept.

BRIEF DESCRIPTION OF THE DRAWINGS

Other features and advantages of the present invention will become apparent as the invention becomes better understood by referring to the following exemplary and non-limiting detailed description of a preferred embodiment thereof and to the drawings, wherein.

DETAILED DESCRIPTION OF THE PREFERRED EMBODIMENT

Figure 1:
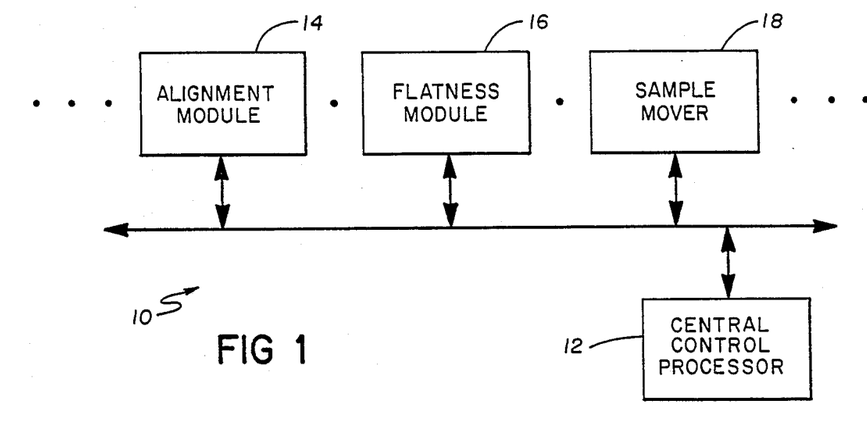
FIG. 1 is a block diagram illustrating one exemplary system where the wafer flatness station according to the present invention has exemplary utility.

Referring now to FIG. 1, generally designated at 10 is a block diagram illustrating one exemplary system where the wafer flatness station according to the present invention has exemplary utility. The system 10 includes a central control processor 12 operatively connected to an alignment station 14, a flatness station 16, and a sample mover 18. The sample mover 18 may, for example, be a pair of spaced rubber belts for moving samples such as semiconductor wafers sequentially through the alignment station 14 and flatness station 16. The wafers may, for example, be loaded on the belts by automated wafer elevators, not shown, to the left of the figure.

The central control processor 12 is operative to actuate the sample mover 18 to move each wafer into the alignment station 14. The central control processor is then operative to command the alignment station to center the wafer about its centroid. After the wafer is centered, the central processor is operative to command the sample mover 18 to move the centered wafer into the flatness station 16. As appears below, the flatness station 16 is operative to obtain a selected flatness profile of the centered wafer. The processor 12 is then operative to command the sample mover to move the wafer either to other selected wafer characterization stations or to an automated wafer elevator for unloading, not shown, to the right of the figure. Although any suitable means may be employed to center the wafer about its centroid, it is preferred that the wafer alignment station disclosed and claimed in co-pending application Ser. No. 360,386 entitled WAFER ALIGNMENT STATION, invented by Neil H. Judell, et al and assigned to the same assignee as the instant invention, incorporated herein by reference, be employed now U.S. Pat. No. 4,457,664.

Figure 2:
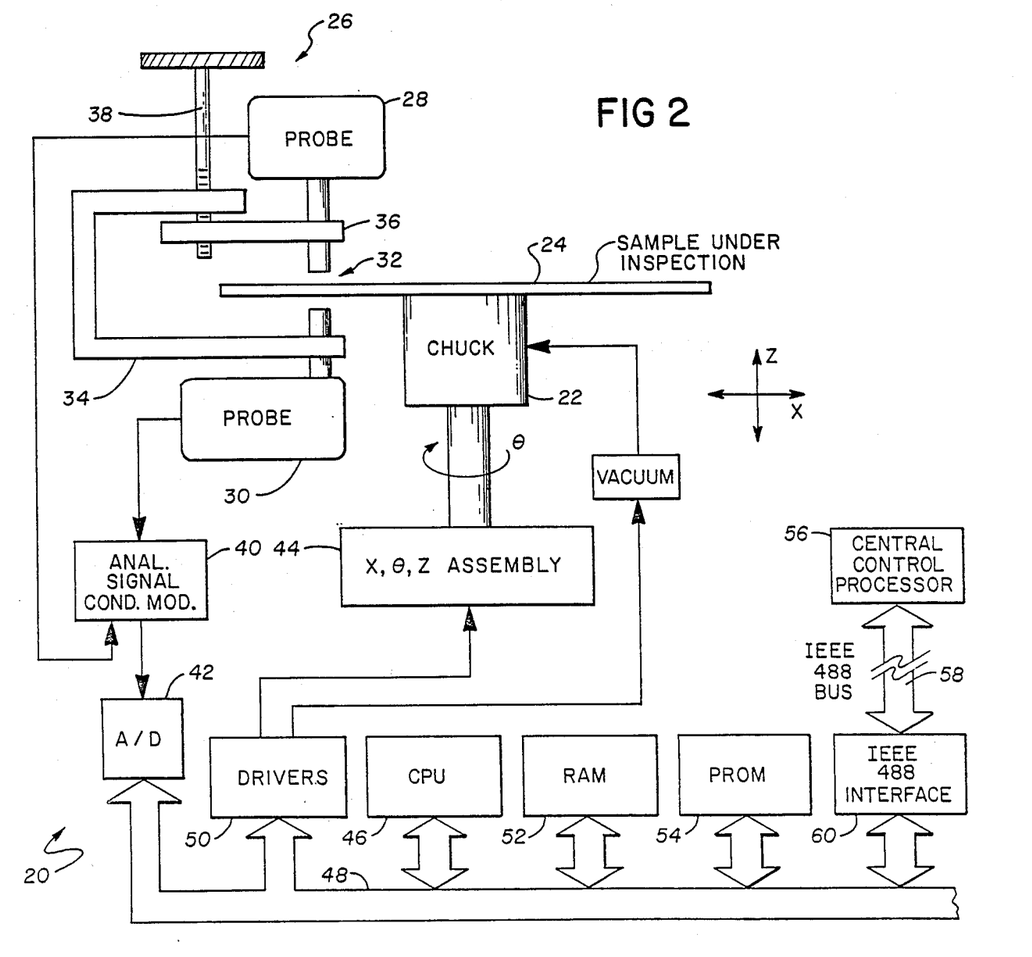
FIG. 2 is a block diagram illustrating the wafer flatness station according to the present invention.

Referring now to FIG. 2, generally designated at 220 is a block diagram illustrating the wafer flatness station according to the present invention. The wafer flatness station 20 includes a vacuum chuck 22 for removably holding a wafer 24 (or other sample), and a sensor generally designated 26 positioned near the chuck 22 that is operative to measure the thickness of any region of the wafer 24 brought into proximity to the sensor. The sensor 26 preferably consists of a first probe 28 and a second spaced apart probe 30 defining therebetween a thickness measuring head generally designated 32. The probes 28, 30 are preferably capacitive sensors. Probe 30 is fixably mounted to a support 34. Probe 28 is mounted in an arm 36 that is threadably fastened as at 38 for relative motion with respect to the support 34 so that the size of the head 32 can be controllably adjusted. An analog signal conditioning unit 40 connected to the output of the probes 28, 30 is operative to provide an analog signal representative of the thickness of successive ones of a plurality of preselected points of the wafer to be described that are successively positioned in the head 32. An analog to digital converter 42 is connected to the output of the analog signal conditioning unit 40 for providing data representative of the thickness of each such preselected wafer point. While any suitable probes 28, 30 and signal conditioning unit 40 may be employed, it is preferred that the capacitive thickness gauging system disclosed and claimed in U.S. Pat. No. 3,990,005 entitled CAPACITIVE THICKNESS GAUGING FOR UNGROUNDED ELEMENTS, invented by Robert C. Abbe, et al and assigned to the same assignee as the instant invention, incorporated herein by reference, be employed.

An X, θ, and Z assembly 44 is operatively connected to the vacuum chuck 22 for rotating the chuck about its axis θ radians, for moving the vacuum chuck along an X axis, and for moving the chuck along a Z axis. The X, θ, and Z assembly 44 is responsive to a plurality of control signals to be described to controllably manipulate the chuck to position successive ones of a preselected plurality of points of the wafer 22 into proximity with the capacitive sensing head 32 that are preferably selected to cover the entire spacial extent of the wafer 24.

A processor 46 is connected to the analog to digital converter 42 over a data bus 48. The processor 46 is operatively connected to the X, θ, and Z assembly 44 over the data bus 48 via conventional latched drivers 50. The processor 46 has RAM 52 and PROM 54 associated therewith in the usual manner. A central control processor 56 is connected to the data bus 48 via a communication link, preferably an IEEE 488 bus 58 and an IEEE 488 interface 60. The processor 46 is slaved to the central control processor 56 and executes instructions to be described downloaded thereto by the central control processor 56 that command it to controllably rotate and translate the chuck 22 to bring preselected points that are located about the center area of the wafer and then to bring preselected points that are located surrounding the center area of the wafer into the capacitive sensing head. Concurrently therewith, the processor 46 reads the output of the A/D converter 42 for each such point and writes it into a RAM memory location via the bus 48. As appears more fully below, the address of each such location corresponds to the spacial location of the associated center or surrounding point location on the wafer. After data collection is complete, the processor 46 sends the thickness data for each wafer back to the central control processor, which is then operative to compute a selected flatness profile for each wafer therefrom.

Figure 3A:
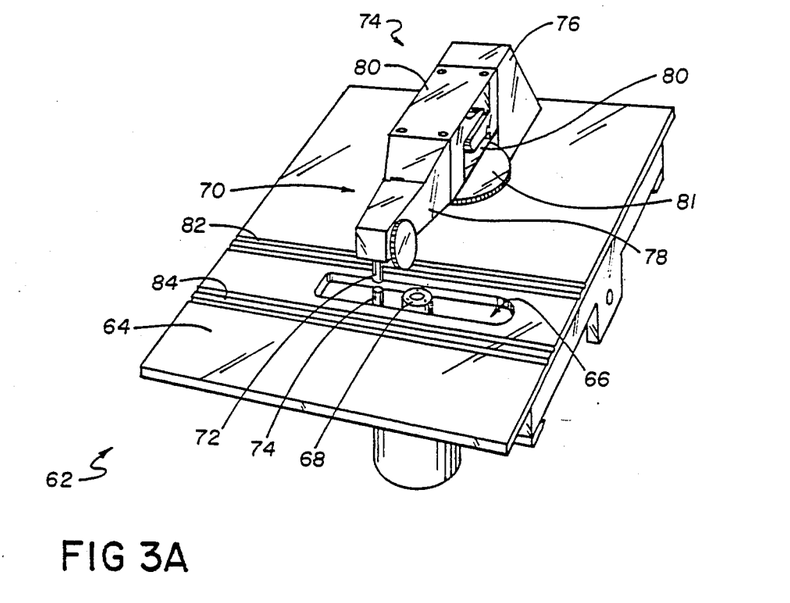
FIG. 3A is a front perspective and FIG. 3B is a rear perspective of the wafer flatness station according to the present invention.

Referring now to FIG. 3A, generally designated at 62 is a front perspective of the wafer flatness station according to the present invention. The station 62 includes a top plate 64 having an elongated slot 66 provided therethrough. A vacuum chuck 68 is positioned in the slot 66 along which is can move in the X direction and through which is can move in the Z direction. A capacitive thickness sensing head generally designated 70 having a first capacitive probe 72 and a second spaced-apart capacitive probe 74 is provided through the slot 66. The position of the probe 74 is fixed, and the position of the probe 72 is mounted in an adjustable arm generally designated 74 for varying its position in the Z direction. The arm 74 includes a first member 76 fastened to the plate 64, a second member 78 fastened to the probe 72, and leaf springs 80 fastened between the members 76, 78. A shaft having an enlarged manually rotatable knob 81 is threadably fastened through the members 76, 78 for controlling the position of the probe 72 in the Z direction. First and second grooves 82, 84 are provided to either side of the slot 66 that are adapted to receive rubber belts, not shown, for moving wafers into and out of the flatness station.

Figure 3B:
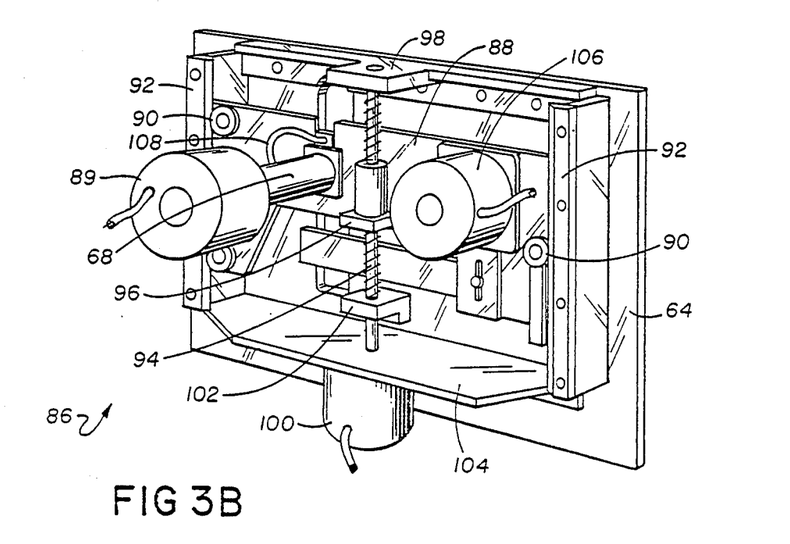

Referring now to FIG. 3B, generally designated at 86 is a rear perspective view of the wafer flatness station according to the present invention. The chuck 68 is fastened to a carriage 88. A Z actuator 89 is provided for controlling the Z coordinate of the position of the vacuum chuck 68. The carriage 88 is slidably mounted over wheels 90 on a pair of parallel guide rails 92. The rails 92 are securely fastened to the plate 64. A worm gear 94 is rotatably mounted in a threaded housing 96 affixed to the carriage 88. One end of the worm gear 94 is rotatably mounted in a journaled bearing 98 that is fastened to the plate 64. The shaft of a X actuating stepper motor 100 is connected through a bearing 102 to the other end of the worm gear 94. The bearing 102 is fastened to the plate 64, and the X stepper motor 100 is fastened to a flange 104. The flange 104 is fastened to the plate 64. A θ stepper motor 106 is fastened to the carriage 88. The shaft of the θ stepper motor 106 is connected over a belted wheel arrangement, not shown, to the shaft of the vacuum chuck 68 to control the θ coordinate of the position of the chuck 68. A vacuum line 108 is coupled to the vacuum chuck 68 for controlling the state of actuation thereof.

The processor 46 (FIG. 2) is operative to produce X, θ, Z and vacuum control signals via the data bus 48 (FIG. 2) to the drivers 50 (FIG. 2) for controlling the state of actuation of the X stepper motor 100, the θ stepper motor 106, the Z actuator 89, and the state of the vacuum. In response to the X control signal, the shaft of the X stepper motor 100 is controllably turned and rotates the worm gear 94 the threads of which engage the threaded housing 96 for controlling the position of the chuck 68 along the X axis. Likewise, the θ coordinate of the chuck 68 is controlled by the θ steppor motor 106 over the belt and wheel assembly in response to the θ control signal, and the Z coordinate of the chuck 68 is controlled by the Z actuator 89 in response to the Z control signal. The "ON" and the "OFF" state of the vacuum applied to the vacuum chuck 68 is controlled by the vacuum line 108.

Figure 4:
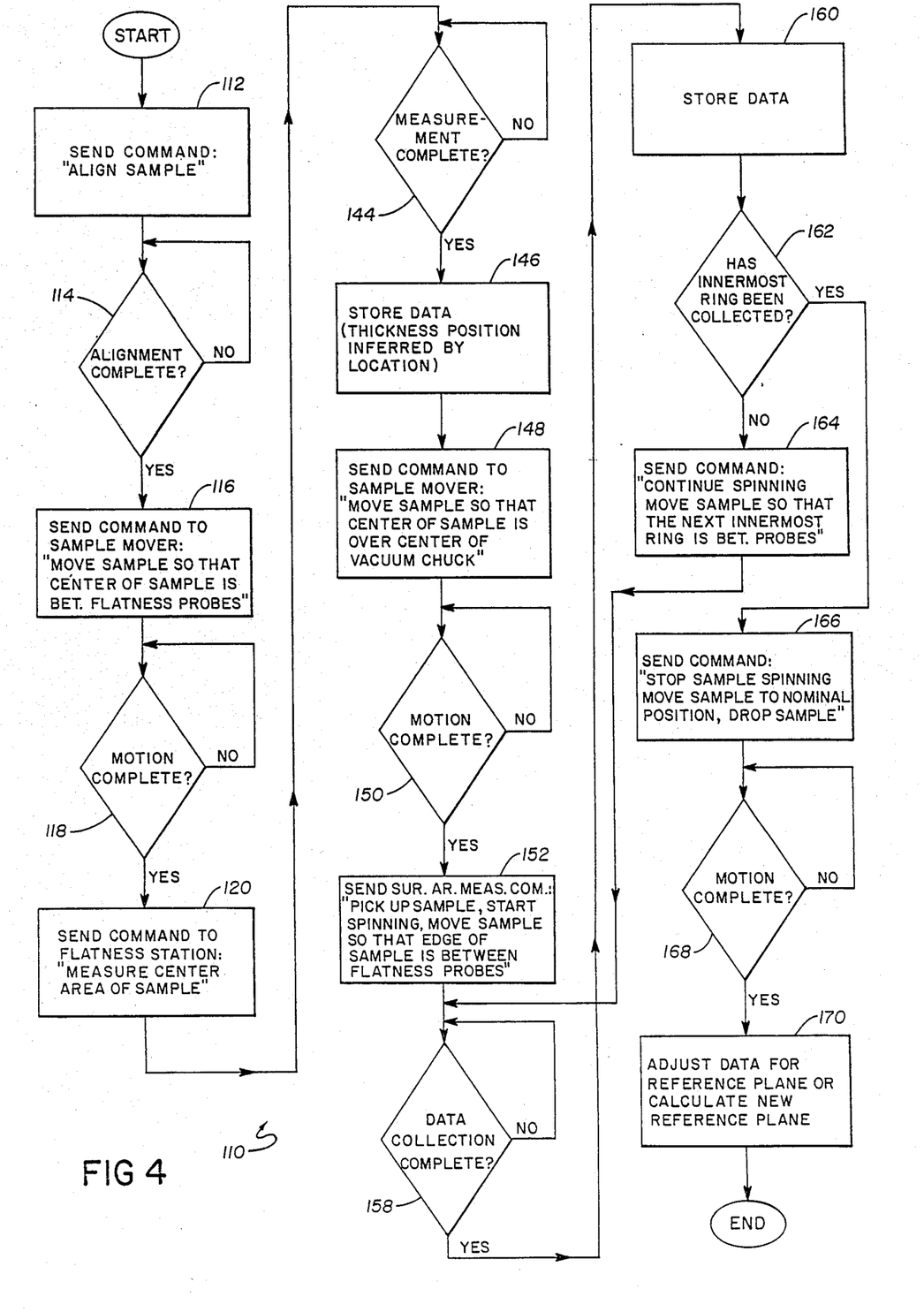
FIG. 4 is a flow chart illustrating the operation of the central control processor of the wafer flatness station according to the present invention.

Referring now to FIG. 4, generally designated at 110 is a flow chart illustrating the operation of the central control processor of the wafer flatness station according to the present invention. As shown by a block 112, the central control processor is operative to send a command to the alignment station 14 (FIG. 1) to align the wafer just moved into the station about its centroid, and waits until the alignment is complete as shown by a block 114. As shown by a block 116, the central control processor is then operative to send a command to the sample mover 18 (FIG. 1) to move the aligned sample such that the centroid of the sample is positioned in the capacitive sensing head 32 (FIG. 2), and waits until the motion is complete as illustrated by a block 118. As shown by a block 120, the central control processor is then operative to send a command to the flatness station processor to measure the center area of the sample.

Figure 5:
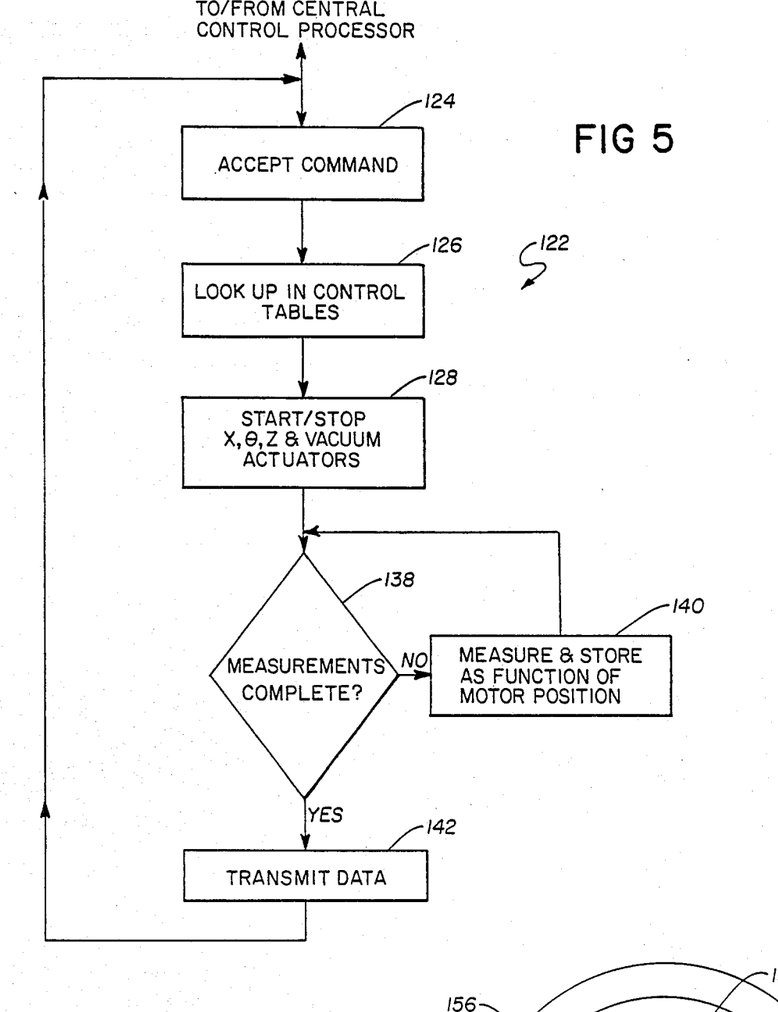
FIG. 5 is a flow chart illustrating the operation of the second processor of the wafer flatness station according to the present invention.
Figure 6:
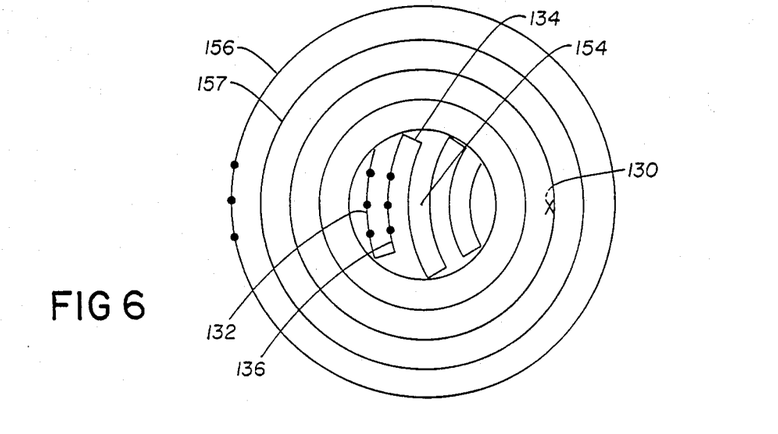
FIG. 6 is a pictorial diagram useful in illustrating the operation of the wafer flatness station according to the present invention.

Referring now briefly to FIG. 5, generally shown at 122 is a flow chart illustrating the operation of the flatness station processor of the wafer flatness station according to the present invention. The processor 46 (FIG. 2) accepts the command to measure the center area of the sample downloaded thereto by the central control processor as shown by a block 124. The wafer flatness station processor decodes the command and fetches from the PROM 54 (FIG. 2) the code that specifies the corresponding X, θ, Z and vacuum control signals that implement the "measure center are of sample" command as shown by a block 126. The processor is then operative to produce control signals to the X, θ, Z and vacuum actuators to move successive ones of a plurality of preselected points selected to cover the entire center area of the sample within the capacitive thickness sensing head as shown by a block 128. The wafer flatness station processor executes the "measure center area of sample" command in preferred embodiment as shown in FIG. 6. The wafer flatness station processor is operative to move the chuck from its nominal position along the X axis to a position 130 designated by an "X" intermediate the periphery of the wafer and the center point, and then actuates the vacuum to pick up the wafer. The processor is then operative to actuate the θ stepper motor to bring successive ones of a plurality of predetermined points, three being specifically illustrated as "dots", located along a first arc 132 successively within the capacitive sensing head of the sensor. After motion along the arc 132 is complete, the processor is operative to actuate the X stepper motor to displace the wafer towards the left as illustrated by the line 134. The processor is then operative to actuate the θ stepper motor to bring successive ones of a plurality of preselected points, three again being specifically illustrated as "dots", located along an arc 136 into the capacitive sensing head. It will be appreciated that the processor is operative to "zig-zag" in this manner through the center area of the sample until all such points located on the "zig-zag" pattern as specified in PROM have been brought within the capacitive sensing head as shown by a block 138. As shown by a block 140, for each such point the processor is operative to store the corresponding value of the analog to digital converter 42 (FIG. 2) in a data table in RAM 52 (FIG. 2) at preselected address locations thereof that respectively correspond to the position of each such center point of the wafer as determined by the θ motor rotary position and X motor rotary position. As shown by a block 142, after the measurements are complete, the flatness station processor is operative to send the data table representative of the thickness of the center area of the sample back to the control processor.

Returning now to FIG. 4, the central control processor waits until the data representative of the thickness of the center area of the wafer has been received as shown by a block 144. As shown by a block 146, the processor is operative to store the wafer thickness data received back from the flatness station processor. As shown by a block 148, the central control processor is then operative to send a command to the sample mover 18 (FIG. 1) to move the sample so that the center of the sample is over the center of the vacuum chuck at its nominal position, and waits until the motion is complete as shown by a block 150. As shown by a block 152, the central control processor is then operative to send a command to the flatness station processor to "measure the area of the wafer surrounding the center area of the wafer".

Returning now briefly to FIG. 5, the flatness station processor accepts the command to measure the area surrounding the center area of the sample downloaded thereto by the central control processor as shown by the block 124. The wafer flatness station processor decodes the command and fetches from the PROM 54 (FIG. 2) the code that specifies the corresponding X, θ, Z, and vacuum control signals that implement the "measure area surrounding the center area" command as shown by the block 126. The processor is then operative to produce control signals to the X, θ, Z, and vacuum actuators to move successive ones of a plurality of preselected points selected to cover the entire area of the sample surrounding the center area of the sample within the capacitive thickness measuring head as shown by the block 128. The wafter flatness station processor executes the "measure area surrounding the center area" command in preferred embodiment as shown in FIG. 6. The area surrounding the center area of the sample is measured by successively taking a plurality of predetermined data points arrayed in concentric rings beginning with an outermost ring first and working inwardly therefrom until the innermost ring is taken. Preferably the central control processor instructs the flatness station processor to do each such ring sequentially. The wafer flatness station processor is operative to actuate the vacuum to pick up the wafer at its center point 154, and to actuate the X steppor motor to translate the chuck until an outermost ring 156 is positioned in the capacitive thickness sensing head. The processor is then operative to actuate the θ steppor motor to successively bring a plurality of preselected points, three being specifically illustrated as "dots", located on the outermost ring 156 successively into proximity with the capacitive sensing head. The flatness station processor rotates the θ steppor motor taking the measurements for the complete ring as shown by the block 138. As shown by the block 140, for each such point the processor is operative to store the reading of the analog to digital converter 42 (FIG. 2) in the data table in RAM 52 (FIG. 2) at preselected address locations thereof that respectively correspond to the position of each such point on the ring 156 as determined by the θ motor rotary position and the X motor rotary position. As shown by the block 142, after the points of the outermost ring are collected in memory, the flatness control processor is operative to transmit the data back to the central control processor.

Returning now to FIG. 4, the central control processor waits until the data for the outermost ring is collected as shown by a block 158, and is then operative to store the received data representative of the thickness of the points along the outermost ring as shown by a block 160. If the innermost ring has not yet been collected as shown by a block 162, the central control processor is operative to send a command to the flatness station processor to continue spinning the wafer and to move it to the next inner ring position 157 (FIG. 6) as shown by a block 164. The flatness control processor receives the command for the next innermost ring, and the process is repeated. As shown by a block 166, after the innermost ring is collected, the central control processor is operative to send a command to the flatness control processor to stop the spinning of the sample, to move the vacuum chuck to its nominal position and drop the sample, and waits until the motion is complete as shown by a block 168. The central control processor is then operative to compute a selected flatness profile from the thickness data as shown by a block 170. The central control processor repeats the above described process for each wafer moved through the flatness station.

It will be appreciated that any selected flatness profile can be computed from the data. For example, a flatness profile can be computed from the plane defined by any three preselected points, from the plane defined by a least mean squares fit to the data, and from the plane defined by an ideal back surface of the wafer, among others. An exemplary algorithm for adjusting the data for a selected reference plate, in Pascal, is as follows:

```
PROCEDURE ADJUST(NUMBER_OF_POINTS: INTEGER;
XPOSITION, YPOSITION, THICKNESS: ARRAY[1..NUMBER_OF_POINTS] OF REAL;
VAR NEWX, NEWY, FLATNESS: ARRAY[1..NUMBER_OF_POINTS] OF REAL;
MATRIX[1..3,1..3] OF REAL;OFFSET_X,OFFSET_Y,OFFSET_Z: REAL);
VAR
I:INTEGER;
BEGIN
FOR I:=1 TO NUMBER_OF_POINTS DO BEGIN
NEWX[I]:=XPOSITION [I] *MATRIX[1,1]+Y POSITION[I]
*MATRIX[1,2] +THICKNESS[I]*MATRIX[1,3]+OFFSET_X;
NEWY[I]:=XPOSITION[I]*MATRIX[2,1]+YPOSITION[I]*MATRIX[2,2]
+THICKNESS[I]*MATRIX[2,3]+OFFSET_Y;
FLATNESS[I]:=XPOSITION[I]*MATRIX[3,1]+YPOSITION[I]*MATRIX[3,2]
+THICKNESS[I]*MATRIX[3,3]+OFFSET_Z;
END; FOR LOOP
END; PROCEDURE
``` where NUMBER_OF_POINTS is preprogrammed; XPOSITION, YPOSITION are preprogrammed; (X,Y) are coordinates of each datum; THICKNESS is stored data from flatness station; and where MATRIX, OFFSET_X, OFFSET_Y, OFFSET_Z are new plane reference calculated.

It will be appreciated that the flatness module of the present invention can advantageously be employed for measuring the flatness of objects other than wafers and that many modifications of the presently disclosed invention are possible without departing from the scope of the appended claims.

What is claimed is:

1. Apparatus for obtaining a flatness profile of a sample to be profiled, comprising:
    sample support means for holding the sample such that a preselected region of the sample to be profiled extends freely in space;
    means for obtaining first data representative of thickness of a plurality of preselected discrete points of the sample selected to substantially cover the preselected spatial region of the wafer to be profiled; and
    means defining a two-dimensional (2-D) reference surface and responsive to the first data for providing second data representative of the two-dimensional flatness of the sample relative to said two-dimensional reference surface, whereby thickness information is converted to flatness information relative to said reference surface.

2. The invention of claim 1, wherein said first data obtaining means includes a thickness sensing head, and means for moving the sample to position successive ones of said plurality of preselected points in said thickness sensing head.

3. The invention of claim 2, wherein said thickness sensing head includes first and second spaced apart capacitive probes.

4. The invention of claim 2, wherein said moving means includes a vacuum chuck.

5. The invention of claim 4, wherein said vacuum chuck is rotatable about its axis θ radians and translatable along orthogonal X and Z axes in response to θ, X, and Z control signals; wherein said thickness sensing head is positioned adjacent said vacuum chuck; and further including means for producing θ, X, and Z control signals to controllably manipulate said vacuum chuck to bring said successive ones of said plurality of preselected points selected to substantially cover the spacial region of the sample to be profiled into proximity with said thickness sensing head.

6. The invention of claim 1, wherein said second data providing means includes a processor operative in response to said first data to calculate said flatness profile.

7. A sample flatness station, comprising:
    means for removably holding a sample for rotation about an axis θ radians, and for translating the sample along orthogonal X and Z axes in response to θ, X, and Z control signals;

a sensor having a thickness measuring head;

means having memory compled to said thickness measuring head and to said holding means operative to product θ, X, and Z control signals that controllably rotate and translate said holding means to successively bring each of a plurality of preselected discrete points of said sample into said thickness measuring head selected to cover substantially the entire spatial extent of the sample and to store data representative of said thickness for each such point in said memory in a data table having preselected address locations that respectively correspond to the location of each such point of the sample; and means defining a two-dimensional (2-D) reference surface and responsive to said data in said data table for computing a selected 2-D flatness profile relative to said 2-D reference to said sample.

8. The invention of claim 7, wherein said holding means includes a vacuum chuck fastened to a carriage, a X stepper motor operatively connected to said carriage for translating said carriage along said X axis, a Z actuator fastened to said carriage for translating said chuck along said Z axis, and a θ stepper motor fastened to said carriage for rotating said chuck θ radians.

9. The invention of claim 7, wherein said sensor is a capacitive sensor.

10. The invention of claim 9, wherein said thickness measuring head includes first and second capacitive probes in spaced apart relation.

11. The invention of claim 10, further including means coupled to one of said probes for moving it in relation to the other of said probes.

12. The invention of claim 7, wherein said means having memory includes a processor.

13. The invention of claim 7, further including means for delivering wafers to and removing wafers from said holding means.

14. A method for obtaining a selected flatness profile of a sample comprising the steps of:

measuring the thickness of the sample sequentially at a plurality of preselected points of the sample;

storing the thickness measurements for each such point at a memory location whose address corresponds to the spatial location of each such point on the sample;

computing the two-dimensional flatness of the sample at the corresponding address locations for all such points.

15. The invention of claim 14, wherein said measuring step includes the steps of supporting the sample at a point remote from its center and successively measuring the thickness of a plurality of preselected discrete points selected at and around the center area of the sample; and supporting the sample at a point proximate its center and successively measuring the thickness of the sample at a plurality of preselected points selected to surround the center area of the sample.

16. The invention of claim 15, wherein said center area measuring step is accomplished by moving the center area of the sample in a predetermined pattern under a thickness sensing head.

17. The invention of claim 16, wherein said predetermined pattern includes a "zig-zag" pattern.

18. The invention of claim 15, wherein said surrounding measuring step is accomplished by moving the sample in a predetermined pattern surrounding the center area of the sample under a thickness sensing head.

19. The invention of claim 18, wherein said predetermined pattern includes concentric rings.

20. The invention of claim 14, wherein said storing step includes storing the thickness measurements for each such point in a data table, the corresponding address locations of which respectively correspond to individual ones of said plurality of preselected discrete points of said sample.

21. A wafer flatness station, comprising:

means for removably holding a wafer for rotation about an axis θ radians, and for translating the wafer along orthogonal X and Z axes in response to θ, X, and Z control signals;

a capacitive sensor having a capacitive thickness measuring head;

means having memory coupled to produce θ, X, and Z control signals that controllably rotate and translate said holding means to successively bring each of a plurality of preselected discrete points of said wafer into said capacitive thickness measuring head selected to cover substantially the entire spatial extent of the wafer and to store data representative of said thickness for each such point in said memory in a data table having preselected address locations that respectively correspond to the location of each such point of the wafer; and means defining a two-dimensional (2-D) reference surface responsive to said data in said data table for computing a selected 2-D flatness profile relative to the 2-D reference surface for said wafer.

* * * * *

UNITED STATES PATENT AND TRADEMARK OFFICE
CERTIFICATE OF CORRECTION

PATENT NO. : 4,860,229

DATED : August 22, 1989

INVENTOR(S) : Robert C. Abbe, Noel S. Poduje, Neil H. Judell

It is certified that error appears in the above-identified patent and that said Letters Patent is hereby corrected as shown below:

In Column 3, line 21, "220" should read --20--.
In Column 4, line 28, "along which is can" should read --along which it can--.
In Column 4, line 29, "which is can" should read --which it can--.
In Column 5, line 12, "steppor" should read --stepper--.
In Column 9, line 4, "compled" should read --coupled--.
In Column 9, line 7, "product" should read --produce--.
In Column 9, line 22, "to" should read --for--.
In Column 6, line 66, "steppor" should read --stepper--.
In Column 7, line 3, "steppor" should read --stepper--.

Signed and Sealed this

Twenty-first Day of April, 1992

Attest:

HARRY F. MANBECK, JR.

*Attesting Officer*  *Commissioner of Patents and Trademarks*